United States Patent [19]

Hsu et al.

[11] 4,363,830

[45] Dec. 14, 1982

[54] METHOD OF FORMING TAPERED CONTACT HOLES FOR INTEGRATED CIRCUIT DEVICES

[75] Inventors: Sheng T. Hsu, Lawrenceville, N.J.; George L. Schnable, Lansdale, Pa.

[73] Assignee: RCA Corporation, New York, N.Y.

[21] Appl. No.: 276,012

[22] Filed: Jun. 22, 1981

[51] Int. Cl.³ ................. H01L 21/283; H01L 21/316
[52] U.S. Cl. ...................................... 427/88; 156/653; 156/657; 427/85; 427/89; 427/93; 427/95; 430/314
[58] Field of Search ....................... 427/85, 88, 89, 93, 427/95; 430/314; 156/653, 657

[56] References Cited

U.S. PATENT DOCUMENTS

| | | | |
|---|---|---|---|
| 2,925,572 | 12/1975 | Naber | 427/87 |
| 3,481,781 | 12/1969 | Kern | 117/215 |
| 4,091,407 | 5/1978 | Williams et al. | 357/54 |
| 4,224,089 | 9/1980 | Nishimoto et al. | 427/88 |
| 4,271,582 | 6/1981 | Shirai | 427/88 |
| 4,273,805 | 6/1981 | Dawson | 427/94 |
| 4,299,862 | 11/1981 | Donley | 427/94 |

OTHER PUBLICATIONS

W. Kern et al., *J. Electrochem. Soc.*: vol. 117, No. 4, (Apr. 1970), "Chemical Vapor Deposition of Silicate Glasses for Use with Silicon Devices", pp. 562-573.
Y. Tanigaki et al., *J. Electrochem. Soc.*: vol. 125, No. 3, (Mar. 1978), "A New Self-Aligned Contact Technology", pp. 471-472.

*Primary Examiner*—John D. Smith
*Attorney, Agent, or Firm*—B. E. Morris; D. S. Cohen; L. P. Benjamin

[57] ABSTRACT

A process for defining improved tapered contact openings in glass coatings comprising the deposition of a layer of low temperature flowable passivating glass and the deposition of a masking layer to initially approximately define contact areas over portions of the active regions and over portions of a gate line. The first contact openings are then etched and the passivating layer caused to reflow followed by a second etch, in the previously etched areas, which second etch accurately defines the contact openings. The final etch rounds off any corners produced by the second etch to produce smoothly tapered contact openings.

4 Claims, 6 Drawing Figures

METHOD OF FORMING TAPERED CONTACT HOLES FOR INTEGRATED CIRCUIT DEVICES

BACKGROUND OF THE INVENTION

This invention relates, in general, to processing semiconductor devices and, more particularly, to an improved method for forming tapered contact openings in insulating layers of semiconductor devices.

It has long been known that there exists a need, in the manufacture of semiconductor devices, to round the corners of contact holes in the lower layers of a multilayer structure so that when subsequent layers are deposited, the surface presented to the subsequently deposited layer will not have sharp or abrupt steps to traverse at the edges of the contact holes. Deposition of the subsequent layers, without the prior removal of the steep step contours may result in cracks or discontinuity in any metal interconnect line which must be deposited in the contact hole. Since a properly tapered and contoured contact hole is the key to successfully interconnecting the various elements of an integrated circuit, it is imperative that the metallization layer be crack-free in order to produce consistently operative devices. Thus, from the point of view of both high reliability and high yield, a smooth contoured contact hole is required for all integrated circuit devices and, in particular, for high density MOS devices.

An additional caveat must be observed when the high density MOS integrated circuit uses scaled MOS field effect transistors (MOSFET's). A scaled device, generally, may be defined as a MOSFET having very shallow source and drain diffusion regions, i.e., diffusion regions that are less than about 0.6 $\mu m$ (microns) deep and a small geometry channel length that is less than about 3.0 microns. Further, these scaled devices may also have relatively thin layers of gate oxide usually less than about 0.03 microns thick. Thus, with shallow diffusion regions, any process step that removes silicon from the diffusion region must be avoided or minimized since excessive thinning of the diffused regions will allow the metal contact to spike through the region into the underlying substrate. Additionally, because of the shallow diffusion regions, scaled MOSFET's are sensitive to precessing steps that require high temperatures since excessive heat will produce an undesirable diffusion of the ion implanted source and drain regions. Thus, since scaled devices are sensitive to the removal of silicon in the implanted regions, the use of plasma or reactive ion etching processes is severely restricted and, since they are also heat sensitive, the common reflow glasses such as the phosphosilicate family of glasses must be avoided to prevent undesired diffusion during the reflow step.

SUMMARY OF THE INVENTION

A novel process is described for forming a contact hole, which may also be used for a buried contact. In our process, a scaled MOSFET device is first formed in a body of single crystalline silicon after which a contact opening is formed. Our process is further noted by the fact that after the drains, sources and gates are formed, the device is neither subjected to a high temperature processing step which would induce unnecessary diffusion of the active regions nor subjected to a processing step which would remove any significant portion of the implanted diffusion region which would allow a subsequent interconnect to spike through to the substrate.

DETAILED DESCRIPTION OF THE INVENTION

In the following description of the invention it should be noted that similar elements in each of the various figures will be similarly numbered. Further, while our invention will be described in terms of processing a bulk silicon device, it should be obvious to those skilled in the art that, with the appropriate changes, our invention has equal applicability to devices made on an insulating substrate. Thus, the body of silicon in which the transistor is formed may be an island of monocrystalline silicon on a sapphire substrate (SOS) which substrate is manufactured with the proper crystallographic orientation. While sapphire is used by way of example, it is understood also that the insulating substrate may be either spinel or monocrystalline aluminum oxide.

Figure 1:
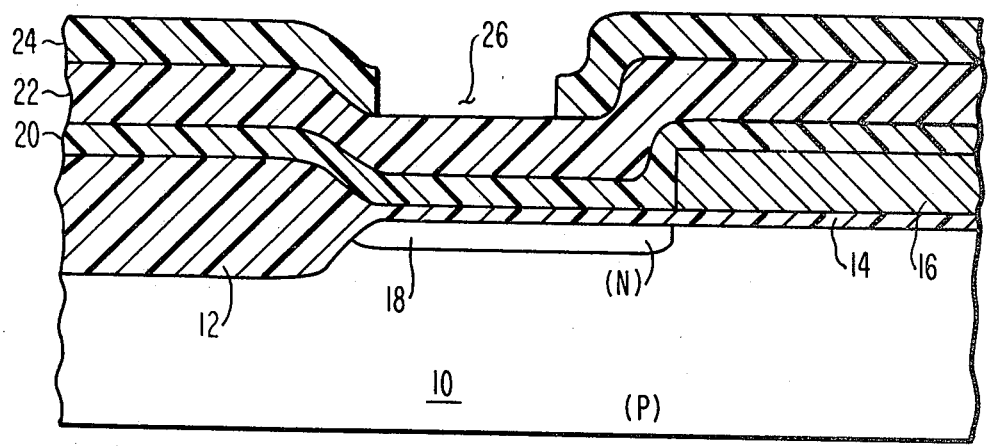
FIGS. 1-6, inclusive, represent sectional views of the novel process of the subject invention indicating the various stages thereof.

Referring now to FIG. 1, it will be seen that a semiconductor device (a portion of which is shown in partial section) has been formed in the usual manner. By way of illustration, a body of single crystalline silicon material 10 (either P-type or N-type) is provided, which body may be a P well 10 formed in a larger body of semiconductor material. In this case, a ring or strip of isolation oxide 12 is provided to isolate the device from the next adjacent device. Also shown is a layer of gate oxide 14, grown on the surface of body 10. A layer of polycrystalline silicon is then deposited over the entire structure and thereafter defined and etched to form gate member 16. Thereafter, source or drain region 18 (of a conductivity opposite to that of well 10) may be implanted in a well-known manner and the entire device then covered with a layer of densified silicon dioxide 20. This layer may be, for example, formed by a chemical vapor deposition (CVD) and covers the entire structure. Typically, the densified CVD oxide layer 20 has a thickness ranging from about 0.2 to about 0.3 micron and has been densified at a temperature ranging from about 900°-950° C. for a period of about 30 minutes. Thereafter, a layer of low temperature flowable passivating glass such as a borophosphosilicate glass (BSPG) 22 is formed as a layer having a thickness of about 0.8-1.0 micron followed by a layer of photoresist 24. All of the previously mentioned layers and their formation are well-known in the art.

Figure 2:
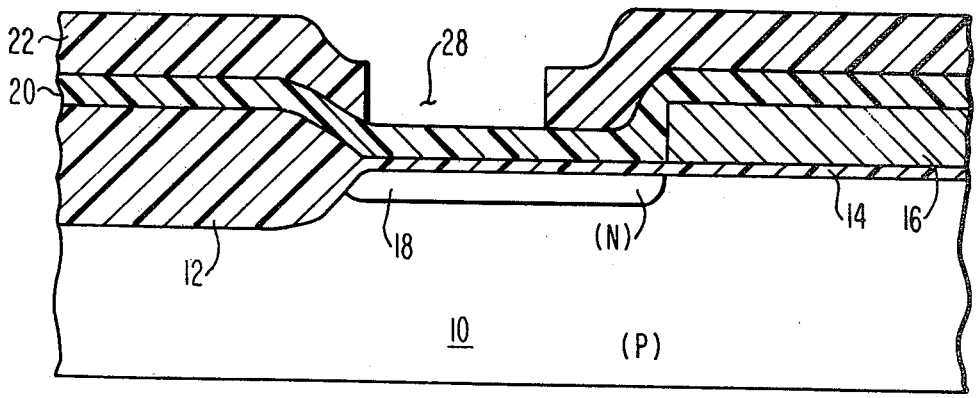

Portions of the photoresist layer are than exposed to radiation and hardened or fixed so that the unexposed portions thereof will adhere to layer 22 while the exposed portions will be washed away to form aperture 26. It should be here noted that aperture 26 is larger than necessary and does not have to be accurately aligned with source region 18. The net result is a patterned layer of photoresist 24 as shown in FIG. 1 wherein aperture 26 is roughly positioned over source region 18. As shown in FIG. 2, BPSG layer 22 has been etched through opening 26 to form contact opening 28. The etching is done, typically, with a buffered HF solution which may also etch the densified oxide layer 20. However, it is only necessary to terminate the etching process before it reaches source region 18. Also, one does not have to be concerned with a slight amount of lateral overetching.

Figure 3:
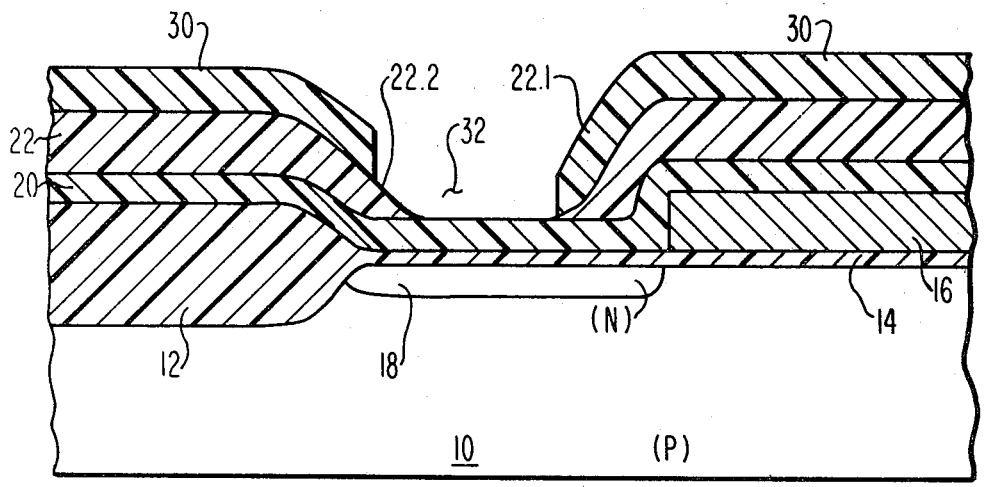

Referring now to FIG. 3 and, in carrying out the basic form of our invention, it should be noted that the BPSG layer 22 has been formed in accordance with the process set forth in U.S. Pat. No. 3,481,781, which issued to W. Kern on Dec. 2, 1969 and is assigned to the same assignee as the subject application. For our invention a BPSG layer having about 3–3½ wt % P and about 2–2½ wt % B (hereinafter referred to as type A), has been deposited to a thickness of 0.8–1.0 micron. It should be understood that this particular BSPG formulation of layer 22 is suggested by way of example only since various other combinations of boron and phosphorous having the appropriate characteristics may be utilized to provide the necessary layer 22. For example, another BPSG layer which has been found to work satisfactorily is one containing 4–5 wt % P and 3–4 wt % B (hereinafter referred to as type B). We have found that type A BPSG will flow at about 900°–950 ° C. and type B BPSG will flow at about 800°–850 ° C. when they are heated in an inert atmosphere such as neon, hydrogen, or helium, for example. Both type A and type B BPSG will flow at a temperature about 50 ° below the temperature indicated for an inert atmosphere if heated in steam. However, this results in a somewhat higher $Q_{SS}$ in the finished device. Thus, depending upon the type of BPSG utilized, after the device has been appropriately heated, the steep sides of aperture 28 (FIG. 2) will be caused to flow and thus provide the tapered or gently undulating surfaces 22.1 and 22.2. This flow of layer 22 may even cover the previously exposed portion of CVD oxide 20 with no ill effect.

Figure 4:
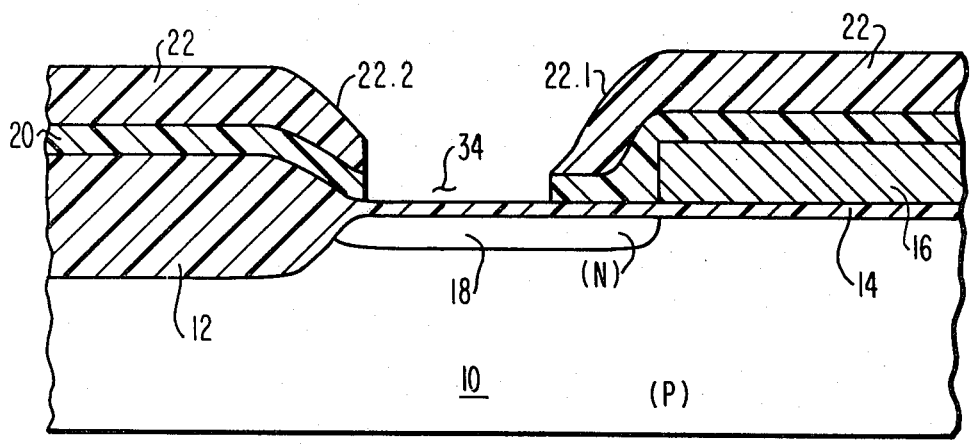

Thereafter, as shown in FIG. 3, the structure is provided with another layer of photoresist 30 which again has portions thereof exposed and hardened to provide a pattern thereon which pattern will define the contact opening 32 through which the remaining layers will be etched. It should be here noted that aperture 32 is the correct size for a contact opening and is more accurately aligned with source region 18. The structure is now subjected to another buffered HF etch which will etch through the densified oxide layer 20 and may even etch a portion of gate oxide layer 14. However, in this instance, it is not particularly desirable to etch entirely through to source region 18. The layer of photoresist 30 is then removed and the resultant structure appears as shown in FIG. 4. At this point, the device may be stored for future use or processing if necessary with no deleterious effects since the only exposed portions are BPSG layer 22 and oxide layer 14.

Figure 5:
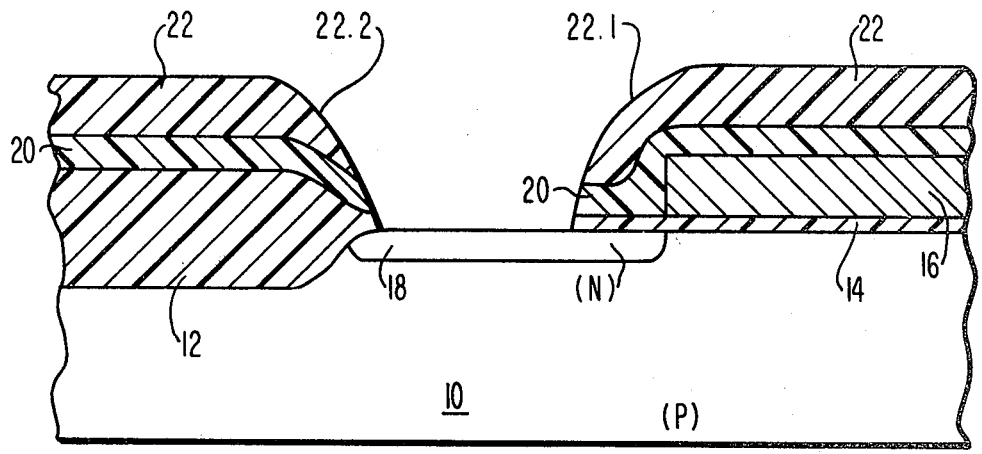

When it is desired to continue the processing, the entire structure is then subjected to a buffered HF dip for only a sufficient period of time to remove any oxide that may still be present at the surface of source region 18 and to round off any sharp corners that may still appear in aperture 34 (FIG. 4). It should be here noted that the standard, commercially available buffered HF will remove about 0.015 micron of BPSG and/or oxide for each 90 second dip. Thus, this final etch step should only be carried on for a sufficient time to expose region 18. The resulting structure will now appear as shown in FIG. 5, wherein the previously tapered edges 22.1–22.2 (FIG. 3) have now been extended down to the surface of source region 18.

Figure 6:
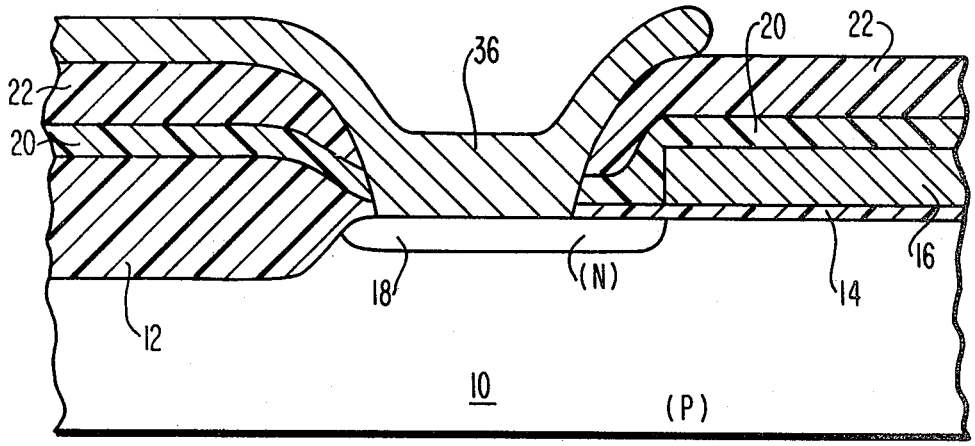

To complete the device, as shown in FIG. 6, a metallization layer 36, which may be aluminum, is then deposited over the entire structure, masked (not shown) and etched to form an interconnect in ohmic contact with source region 18.

Thus, we have described our novel method of forming tapered contact holes wherein low temperature process steps are utilized during reflow in order to avoid the undesired diffusion of the implanted regions and selective etching steps are utilized in order not to remove silicon in the implanted region.

What we claim is:

1. In a process for manufacturing an MOS device having a first layer of insulating material formed on the entire surface of a semiconductor body of a given conductivity type, a pair of active regions of opposite conductivity type and a channel region therebetween embedded in the body of semiconductor material at the surface thereof, a conductive gate line disposed of the first layer of insulating material and aligned with the channel region, the improved process for forming a contact hole to an active region and to the gate line comprising the steps of:

depositing a second layer of insulating material over the exposed surfaces of the device;

depositing a layer of low temperature flowable passivating glass over the second layer of insulating material;

forming a patterned layer of masking material over the layer of passivating glass to approximately define contact areas over portions of the active regions and over portions of the gate line;

etching those portions of the layer of passivating glass exposed by the patterned masking layer at least through the layer of passivating glass and at most only partially through the second layer of insulating material;

removing the layer of masking material;

heating the structure to the flow temperature of the passivating glass layer for a period of time sufficient to round any sharp edges formed during the etching thereof;

forming a second patterned layer of masking material over the layer of passivating glass to accurately define contact openings within the previously etched areas over portions of the active regions and over portions of the gate line;

etching those exposed portions of the layer of passivating glass exposed by the second patterned masking layer at least through both the layer of passivating glass and the second layer of insulating material and at most only partially through the first layer of insulating material;

removing the second patterned layer of masking material;

etching the structure for a period of time sufficient to remove any remaining portions of the first layer of insulating material exposed in the contact hole and to round any sharp edges formed in the passivating layer and in the second layer of insulating material; and forming contact lines to the contact openings, in ohmic contact with respective active regions and with the gate line.

2. The process of claim 1, wherein the step of depositing the second layer of insulating material comprises:

vapor depositing a layer of silicon dioxide to a thickness ranging from about 0.2 micron to about 0.3 micron; and densifying the layer of chemically vapor deposited silicon dioxide at a temperature ranging from about 900°–950° C. for a period of about 30 minutes.

3. The process of claim 2, wherein the step of depositing a flowable passivating glass layer comprises:

depositing a borophosphosilicate glass selected from the group consisting of:

(1) 3–3½ wt % P and 2–2½ wt % B;

(2) 4–5 wt. % P and 3–4 wt % B;

depositing the passivating glass to a thickness ranging from about 0.8 to about 1.0 micron.

4. The process of claim 3, wherein the step of heating the structure to the flow temperature comprises the step of heating the borophosphosilicate glass to about 800°–950° C. in an inert atmosphere.

* * * * *